United States Patent
Glovatsky et al.

[19]

[11] Patent Number: 5,929,375
[45] Date of Patent: *Jul. 27, 1999

[54] EMI PROTECTION AND CTE CONTROL OF THREE-DIMENSIONAL CIRCUITIZED SUBSTRATES

[75] Inventors: Andrew Zachary Glovatsky, Ypsilanti; Michael George Todd, South Lyon; Richard Keith McMillan, II, Dearborn, all of Mich.

[73] Assignee: Ford Motor Company, Dearborn, Mich.

[ * ] Notice: This patent issued on a continued prosecution application filed under 37 CFR 1.53(d), and is subject to the twenty year patent term provisions of 35 U.S.C. 154(a)(2).

[21] Appl. No.: 08/644,100

[22] Filed: May 10, 1996

[51] Int. Cl.⁶ ..................................................... H05K 9/00
[52] U.S. Cl. ..................... 174/35 R; 174/35 C; 174/255; 174/252
[58] Field of Search .............................. 174/35 R, 35 MS, 174/255, 256, 257, 252, 35 C; 361/780, 792, 793, 794, 795, 816, 818; 439/79, 931

[56] References Cited

U.S. PATENT DOCUMENTS

| | | |
|---|---|---|
| 3,932,932 | 1/1976 | Goodman . |
| 4,596,670 | 6/1986 | Liu .......................................... 252/511 |
| 4,639,056 | 1/1987 | Lindeman et al. ......................... 439/61 |
| 4,687,267 | 8/1987 | Header et al. ............................. 439/62 |
| 4,793,816 | 12/1988 | Pittman et al. ............................ 439/79 |
| 4,879,630 | 11/1989 | Boucard et al. ......................... 361/722 |
| 4,935,284 | 6/1990 | Puerner ................................... 428/137 |
| 5,012,047 | 4/1991 | Dohya ..................................... 174/250 |
| 5,060,113 | 10/1991 | Jacobs ..................................... 361/721 |
| 5,166,772 | 11/1992 | Soldner et al. .......................... 257/659 |
| 5,250,342 | 10/1993 | Lang et al. .............................. 428/138 |
| 5,418,693 | 5/1995 | Perry ....................................... 361/816 |
| 5,428,506 | 6/1995 | Brown et al. ........................... 361/794 |
| 5,461,201 | 10/1995 | Schonberger et al. ................. 174/16.3 |
| 5,521,785 | 5/1996 | Schmidt et al. ........................ 361/720 |
| 5,574,630 | 11/1996 | Kresge et al. .......................... 361/792 |
| 5,609,491 | 3/1997 | Cooper et al. ............................. 439/79 |
| 5,657,203 | 8/1997 | Hirao et al. ............................. 361/707 |

FOREIGN PATENT DOCUMENTS

| | | |
|---|---|---|
| 0058759 | 9/1982 | European Pat. Off. . |
| 0393312 | 10/1990 | European Pat. Off. . |
| 1432771 | 2/1966 | France . |
| 1916308 | 10/1970 | Germany . |
| 19523364 A1 | 1/1996 | Germany . |
| 2000913 | 6/1978 | United Kingdom . |

*Primary Examiner*—Kristine Kincaid
*Assistant Examiner*—Hung V Ngo
*Attorney, Agent, or Firm*—Leslie C. Hodges; Roger L. May

[57] ABSTRACT

A circuit board includes a substantially non-conductive substrate and first and second rigid sheets. The first sheet forms a grid pattern substantially encapsulated by the substrate, and a portion of the first sheet extends beyond a boundary of the substrate to form a first interconnection terminal. The second sheet is also substantially encapsulated by the substrate and has a portion which extends beyond the boundary of the substrate to form a second interconnection terminal. The second sheet acts as an electromagnetic interference shield, and also has a coefficient of thermal expansion less than a coefficient of thermal expansion of the substrate.

13 Claims, 1 Drawing Sheet

EMI PROTECTION AND CTE CONTROL OF THREE-DIMENSIONAL CIRCUITIZED SUBSTRATES

TECHNICAL FIELD

This invention relates to molded circuit boards and, more particularly, to a three-dimensional molded circuit board having an in-molded electromagnetic interference shield.

BACKGROUND ART

Conventional planar printed wiring boards (PWBs) have been replaced by three-dimensional molded circuit boards in many applications, such as in cellular telephones, pagers and computers. The three-dimensional circuit boards act as a substrate for the metallized circuitry, plated through-holes and electronic components which are subsequently mounted onto the circuitry.

These molded circuit boards are normally comprised of polymeric materials such as polyetherimide (PEI), acrylonitrile-butadiene-styrene (ABS) and polypropylene (PP), which have large coefficients of thermal expansion (CTE) relative to the metallization and the electronic components. This difference in CTE can degrade the long term reliability of the final electronic assembly when exposed to repetitive thermal variations. The molded circuit board is also susceptible to electromagnetic interference (EMI) which affects the function of the circuitry.

SUMMARY OF THE INVENTION

The present invention is a circuit board comprising a substrate, electrical circuitry disposed on a surface of the substrate, and a rigid sheet substantially encapsulated by the substrate. The rigid sheet shields the electrical circuitry from electromagnetic interference generated on a side of the sheet opposite from the electrical circuitry. Optionally, a portion of the sheet extends beyond a boundary of the substrate to form an interconnection terminal.

In another embodiment of the invention, the circuit board comprises a substrate and first and second rigid sheets. The first and second rigid sheets are substantially encapsulated by the substrate. A portion of the first rigid sheet extends beyond a boundary of the substrate to form an interconnection terminal.

Accordingly, it is an object of the present invention to provide a circuit board of the type described above which protects the electronics on or near the circuit board when exposed to repetitive thermal variations.

Another object of the present invention is to provide a circuit board of the type described above which protects the electronics on or near the circuit board from electromagnetic interference.

Another object of the present invention is to provide a circuit board of the type described above for use in environments such as motor vehicles where EMI protection is particularly desirable.

These and other objects, features, and advantages of the present invention are readily apparent from the following detailed description of the best mode for carrying out the invention when taken in conjunction with the accompanying drawings.

BEST MODE FOR CARRYING OUT THE INVENTION

Figure 1:
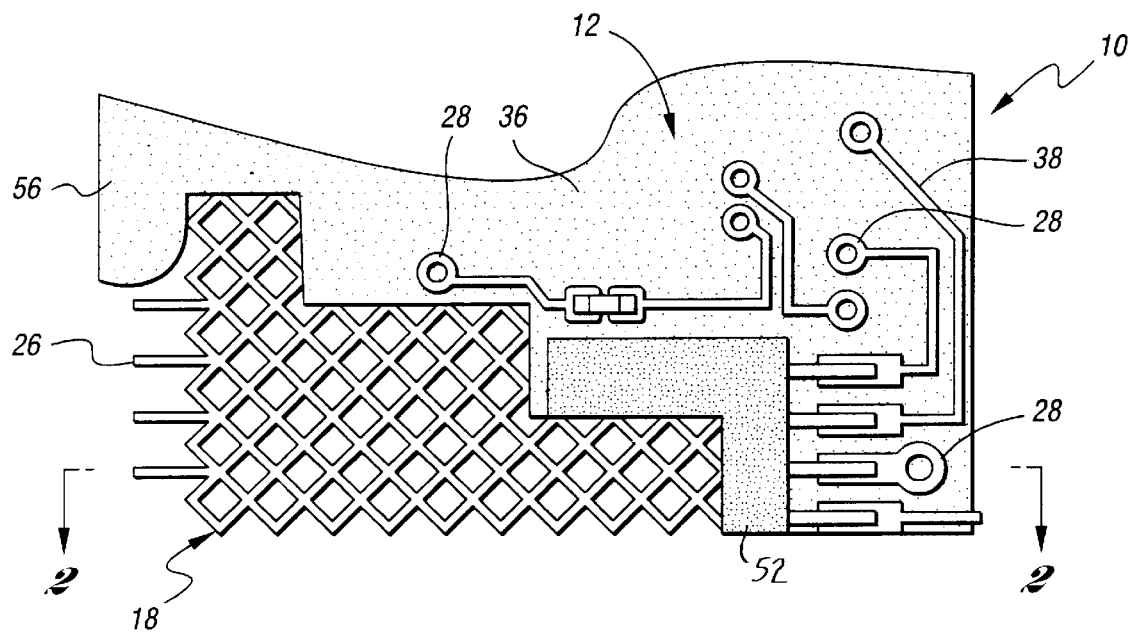
FIG. 1 is a top view, partially in cross-section, of a circuit board according to the present invention.
Figure 2:
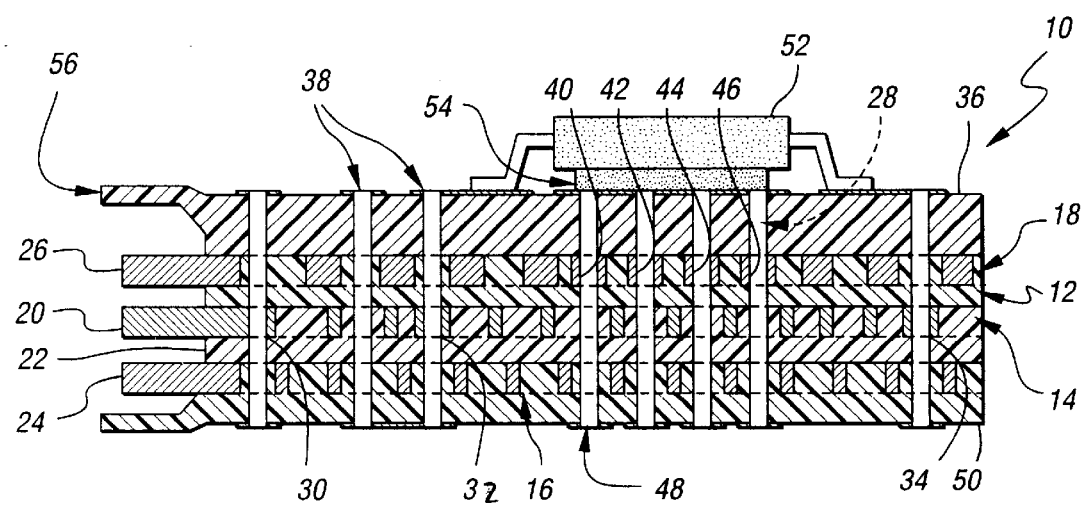
FIG. 2 is a cross-sectional view taken along line 2—2 in FIG. 1.

With reference to the drawings, the preferred embodiments of the present invention will be described. FIGS. 1 and 2 show a molded circuit board 10 according to the present invention. The circuit board 10 includes a three-dimensional substrate 12 and first, second and third sheets 14, 16 and 18, respectively.

The substrate 12 is substantially non-conductive, preferably formed from a plastic such as PEI, ABS or PP. The first sheet 14 is preferably a rigid, conductive material such as a relatively heavy gauge metallic sheet stock mesh stamping or etching. The first sheet 14 is substantially encapsulated by the substrate 12, except for an edge connector portion or pin 20 that extends beyond the lateral boundary of the substrate defined by the side wall 22. Like the first sheet 14, the third sheet 18 is preferably a rigid, conductive material such as a heavy gauge metallic mesh. The sheets 16 and 18 are also substantially encapsulated by the substrate 12, except for respective edge connector portions or pins 24 and 26 that extends beyond the side wall 22 of the substrate. The sheets 14, 16 and 18 are preferably molded into the substrate 12 during the injection molding, thermoforming, blow molding, lamination or other molding process.

The sheets 14, 16 and 18 are formed in similar, although not necessarily identical, grid patterns. Through-holes 28 drilled or otherwise formed in the substrate 12 and plated with a conductive material electrically connect a plurality of locations 30, 32 and 34 on the first sheet 14 with a first or upper surface 36 of the substrate. Various electrical surface circuitry 38 mounted on the upper surface 36 communicates via the through-holes 28 with the first sheet 14 at the locations 30, 32 and 34. Locations 40, 42, 44 and 46 of the third sheet 18 are likewise in electrical communication with electrical components 48 on a lower surface 50 of the substrate. Optionally, electrical components such as an small outline integrated circuit package 52 bonded with a thermal adhesive 54 or otherwise mounted on the upper surface 36 of the substrate also communicate with the sheet 18.

The pins 20, 24 and 26 are integrally formed with respective layers 14, 16 and 18, and are disposed within a connector shroud or housing 56 molded in the substrate 12. The pins 20, 24 and 26 are adapted to form terminals for physical and electrical interconnection with an external connector. For example, the sheet 14 may be designed as a power or signal plane, and the sheet 18 may be designed as a ground plane. Thus, a wide variety of three-dimensional circuit paths are available on the circuit board 10, either alone or in conjunction with other circuits mating with the board 10 through the pins 20 and 26. For example, specific through-holes 28 are only joined with the ground plane 18, while other through-holes interconnect with the power layer 14. The layers 14 and 18 can be designed prior to fabrication, or a generic mesh layer pattern can be machined via drilling to define the circuit layout after molding to provide defined circuit paths between components, through-holes and terminal pins.

The unconnected sheet 16 acts as a shield to inhibit the EMI susceptibility of the circuit board 10, and particularly the sheets 14 and 18 and the surface circuitry 38. To achieve this effect, the shield 16 can be either a metal stamping, an etched metal sheet or a woven metallic screen of a given thickness, patterning and three-dimensional shape. The shield 16 can be sized to protect the entire board 10 or specific areas of a board.

To provide the further advantage of controlling the CTE of the circuit board 10, the shield 16 is preferably comprised of a material having high EMI attenuating characteristics with a low CTE relative to the substrate material. In addition, the material thickness of both the metal layers and the dielectric substrate material between layers is controlled to achieve the desired degree of CTE control. Copper, a copper-beryllium alloy or a carbon fiber composite are materials suitable for this purpose. For example, ABS normally has a CTE ranging from 6–13×10^–5 ppm/C, while copper normally has a CTE of approximately 17.6×10^–6 ppm/C. Alternatively, the EMI shield 16 can be formed by molding a plated mylar film with a grid or mesh pattern in situ in the substrate 12. Prior to the in-molding, wire mesh is ultrasonically embedded in the film to form a laminated film stock.

As an alternative to molding the shield 16 in situ, a first three-dimensional molded plastic substrate is plated with an EMI mesh, and then the mesh is over molded in a second molding operation to produce a final part having the plated EMI shield completely embedded in bulk of the substrate 12. The part can then be drilled, photoimaged and plated to create circuitry and plated through-holes in the substrate.

Integrated into the bulk of the molded substrate, the metal shield 16 acts to constrain the CTE of the plastic and provide EMI protection to the circuitry and components located on the side of the shield opposite of the EMI source. Controlling the difference in CTEs between the substrate 12 and the metallization and the electrical components improves the reliability of the circuit board 10.

It should be understood that while the forms of the invention herein shown and described constitute preferred embodiments of the invention, they are not intended to illustrate all possible forms thereof. For example, additional molded-in shields or layers with independent interconnect pins to the EMI shield, signal and power planes can be provided. It should also be understood that the words used are words of description rather than limitation, and various changes may be made without departing from the spirit and scope of the invention disclosed.

What is claimed is:

1. A circuit board comprising:
    a substrate having a top surface and a bottom surface, the substrate comprising a thermoplastic polymeric material;
    electrical circuitry disposed on the top and bottom surfaces of the substrate;
    a rigid planar sheet forming a grid pattern substantially encapsulated by the substrate, the rigid sheet shielding the electrical circuitry from electromagnetic interference originating on a side of the sheet opposite from the electrical circuitry;
    a plurality of electrically conductive through holes extending between the top surface and the bottom surface of the substrate, the plurality of through holes being unitary in construction and connecting the electrical circuitry disposed on the top surface with the electrical circuitry disposed on the bottom surface; and
    a plurality of edge connector portions integrally formed with the rigid planar sheet in the substrate extending outward beyond a side wall of the substrate, wherein the plurality of edge connector portions are formed in the same plane as the rigid planar sheet, the edge connector portions electrically connecting the rigid planar sheet to the top surface of the substrate,
    wherein said substrate includes a connector shroud portion molded therein extending beyond the side wall generally about the edge connector portions,
    wherein the edge connector portions and the connector shroud portion are designed to physically and electrically connect the sheet to an external connector.

2. A circuit board comprising:
    a three dimensional substrate having a top surface and a bottom surface, the substrate comprising a thermoplastic polymeric material;
    electrical circuitry disposed on the top and bottom surfaces of the substrate;
    a rigid first planar sheet comprising a conductive material, the first planar sheet forming a grid pattern substantially encapsulated by the substrate, the first planar sheet including an integrally formed portion extending beyond a side wall of the substrate to form a first interconnection terminal, wherein the integrally formed portion is formed in the same plane as the first planar sheet;
    a rigid second planar sheet comprising a conductive material, the second planar sheet substantially encapsulated by the substrate, the second planar sheet including an integrally formed portion which extends beyond the side wall of the substrate to form a second interconnection terminal, wherein the portion is integrally formed with the second planar sheet and is formed in the same plane as the second planar sheet, the second planar sheet having high electromagnetic interference attenuating characteristics and a coefficient of thermal expansion less than a coefficient of thermal expansion of the substrate;
    a grounded third planar sheet substantially encapsulated by the substrate, the third planar sheet including a plurality of integrally formed portions integrally extending beyond the side wall of the substrate to form a third interconnection terminal; and
    a plurality of electrically conductive through holes extending between the top surface and the bottom surface of the substrate, wherein the through holes are unitary in construction and connect the circuitry disposed on the top and bottom surfaces of the substrate, wherein the plurality of through holes extend through and electrically connect the first planar sheet and the third planar sheet such that the first planar sheet and the third planar sheet are in electrical communication with the top and bottom surfaces of the substrate,
    wherein the substrate includes a connector shroud portion molded therein extending beyond the side wall generally about said first, second and third interconnection terminals.

3. A circuit board comprising:
    a three dimensional substrate having a top surface and a bottom surface, the substrate comprising a thermoplastic polymeric material;
    electrical circuitry disposed on the top and bottom surfaces of the substrate;
    a rigid first planar sheet comprising a conductive material, the first planar sheet substantially encapsulated by the substrate, the first planar sheet including an integrally formed portion extending beyond a side wall of the substrate to form a first interconnection terminal;
    a rigid second planar sheet comprising a conductive material, the second planar sheet substantially encapsulated by the substrate and having a portion which extends beyond the side wall of the substrate to form a second interconnection terminal, the second sheet having high electromagnetic interference attenuating characteristics and a coefficient of thermal expansion less than a coefficient of thermal expansion of the substrate; and a grounded third planar sheet substantially encapsulated by the substrate, the third planar sheet including a plurality of integrally formed portions extending beyond the side wall of the substrate to form a third interconnection terminal;

wherein the substrate includes a connector shroud portion molded therein extending beyond the side wall generally about said first, second and third interconnection terminals.

4. The circuit board of claim 3 wherein the integrally formed portion of the first planar sheet is formed in the same plane as the first planar sheet.

5. The circuit board of claim 3 wherein the portion of the second planar sheet is formed in the same plane as the second planar sheet.

6. The circuit board of claim 3 wherein the plurality of integrally formed portions of the third planar sheet are formed in the same plane as the third planar sheet.

7. The circuit board of claim 3 further comprising a plurality of electrically conductive through holes extending between the top surface and the bottom surface of the substrate, wherein the through holes are unitary in construction and connect the circuitry disposed on the top and bottom surfaces of the substrate.

8. The circuit board of claim 7 wherein the plurality of through holes extend through and electrically connect the first planar sheet and the third planar sheet such that the first planar sheet and the third planar sheet are in electrical communication with the top and bottom surfaces of the substrate.

9. The circuit board of claim 3 wherein the second planar sheet comprises metal.

10. The circuit board of claim 9 wherein the second planar sheet comprises copper.

11. The circuit board of claim 3 wherein the second planar sheet comprises carbon fiber composite.

12. The circuit board of claim 3 wherein the first planar sheet forms a grid pattern.

13. The circuit board of claim 3 wherein the first planar sheet forms a substantially solid plane.

* * * * *